(12) United States Patent
Yamanaka et al.

(10) Patent No.: US 8,773,214 B2
(45) Date of Patent: Jul. 8, 2014

(54) SAW DEVICE, SAW OSCILLATOR, AND ELECTRONIC APPARATUS

(75) Inventors: Kunihito Yamanaka, Kamiina (JP); Naohisa Obata, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/557,748

(22) Filed: Jul. 25, 2012

(65) Prior Publication Data
US 2013/0027144 A1    Jan. 31, 2013

(30) Foreign Application Priority Data
Jul. 28, 2011    (JP) .................................. 2011-165798

(51) Int. Cl.
*H03B 5/30*    (2006.01)
(52) U.S. Cl.
USPC ................... 331/155; 331/107 A; 331/116 M; 331/154
(58) Field of Classification Search
USPC ...... 331/107 A, 116 M, 116 R, 154, 155, 158; 310/344, 345, 348, 365
See application file for complete search history.

(56) References Cited

U.S. PATENT DOCUMENTS

| 6,229,249 B1 * | 5/2001 | Hatanaka et al. | 310/348 |
| 7,135,810 B2 * | 11/2006 | Okajima | 310/348 |
| 2009/0023400 A1 * | 1/2009 | Nishio | 455/91 |

FOREIGN PATENT DOCUMENTS

| JP | 2003-309447 | 10/2003 |
| JP | 2005-136938 | 5/2005 |

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A SAW device includes a SAW chip formed of a piezoelectric substrate and an IDT formed thereon, a base substrate that supports the SAW chip, and a fixing member that fixes the SAW chip to the base substrate. The SAW chip that forms a cantilever is supported by the base substrate via the fixing member in a position where the IDT does not overlap with the fixing member in a plan view of the SAW chip. The length W of the SAW chip in a y-axis direction and the length D of the fixing member in the y-axis direction satisfy $1<D/W\leq1.6$. The fixing member bonds the lower surface and side surfaces of the fixed end of the SAW chip to the base substrate.

20 Claims, 9 Drawing Sheets

SAW DEVICE, SAW OSCILLATOR, AND ELECTRONIC APPARATUS

BACKGROUND

1. Technical Field

The present invention relates to a SAW device, a SAW oscillator, and an electronic apparatus.

2. Related Art

A SAW device (surface acoustic wave device) is a circuit element that converts an electric signal into a surface wave for signal processing and widely used as a filter, a resonator, and other components. A known configuration of such a SAW device includes a SAW chip formed of a piezoelectric substrate made of quartz or any other piezoelectric material and an IDT electrode (comb electrode) provided on the piezoelectric substrate and a base substrate to which the SAW chip is fixed with an adhesive (see JP-A-2005-136938, for example).

The SAW device described in JP-A-2005-136938 includes a SAW chip having an IDT electrode provided on a quartz substrate and a base substrate that supports the SAW chip with an adhesive therebetween. In JP-A-2005-136938, the SAW chip has a mounting portion that is located in one end portion of the SAW chip but does not overlap with the IDT electrode, and the mounting portion is bonded to the base substrate with an adhesive therebetween, whereby the SAW chip forms a cantilever supported by the base substrate. It is known that supporting the SAW chip as a cantilever as described above improves an aging characteristic of the SAW chip (reduces the amount of time-course variation in oscillating frequency).

Further, in the SAW device described in JP-A-2005-136938, pads formed on the SAW chip are electrically connected to pads formed on the base substrate with wires (bonding wires).

In the thus configured SAW device, the SAW chip needs to be firmly bonded to the base substrate. The firm bonding suppresses unnecessary vibration of the SAW chip produced when the wires (bonding wires) are connected to the SAW chip in an ultrasonic bonding process, whereby the wires can be more firmly bonded to the SAW chip.

The SAW device is further preferably so configured that the SAW chip is parallel to the base substrate in order to prevent the SAW chip from being broken or fractured. The parallel configuration prevents the free end of the SAW chip from coming into contact with the base substrate or other components, effectively preventing the SAW chip from being broken or fractured. The parallel configuration further allows ultrasonic vibration to be efficiently applied to the SAW chip when the wires are connected to the SAW chip in the ultrasonic bonding process, whereby the wires can be more firmly bonded to the SAW chip.

To meet the requirements described above, it is conceivable to increase the area where an adhesive is applied onto the SAW chip. In this case, however, the state in which the base substrate supports the SAW chip changes as the adhesive area increases from "cantilever support" to "entire-area support." The change in the state degrades the aging characteristic of the SAW chip.

To address the problem, in the SAW device descried in JP-A-2005-136938, the SAW chip has a relatively large mounting portion formed in one end portion thereof, and the mounting portion is fixed to the base substrate with an adhesive to achieve a state in which the SAW chip is cantilever-supported by and firmly bonded to the base substrate. In the SAW device described in JP-A-2005-136938, relatively high-level aging characteristic, bonding strength, and parallelism are therefore achieved.

In consideration of characteristics and precision of a SAW device that are required in recent years and in the future, however, the SAW device described in JP-A-2005-136938 is insufficient in terms of the requirements described above (bonding strength and parallelism, in particular) and hence required to be improved.

SUMMARY

An advantage of some aspects of the invention is to provide a SAW device, a SAW oscillator, and an electronic apparatus that achieve high-level aging characteristic, bonding strength, and parallelism.

Application Example 1

A SAW device according to this application example of the invention includes a SAW chip including a plate-shaped piezoelectric substrate and a comb electrode disposed on the piezoelectric substrate, a base substrate on which the SAW chip is mounted, and a fixing member that fixes the SAW chip to the base substrate and supports the SAW that forms a cantilever in a position where the comb electrode does not overlap with the fixing member in a plan view of the SAW chip, wherein the comb electrode is disposed on a surface of the piezoelectric substrate that faces away from the base substrate, a length W of the SAW chip in a first direction and a length D of the fixing member in the first direction satisfy $1 < D/W \leq 1.6$, the first direction being perpendicular to a direction in which a fixed end and a free end of the SAW chip are apart from each other in a plan view of the base substrate, and the fixing member bonds a surface of the fixed end of the SAW chip that faces the base substrate and a pair of side surfaces of the fixed end of the SAW chip that face each other in the first direction to the base substrate.

According to this application example, a SAW device having a high-level aging characteristic, bonding strength, and parallelism can be provided. Specifically, variation in frequency of the SAW device having been driven continuously for 10 years in an atmosphere of a room temperature (25° C.)±20° C. falls within ±10 ppm.

Application Example 2

In the SAW device according to the application example, it is preferable that the piezoelectric substrate is made of quartz.

According to this application example, excellent temperature and frequency characteristics are achieved.

Application Example 3

In the SAW device according to the application example, it is preferable that the fixed end of the piezoelectric substrate has a thickness t, and the fixing member reaches a height greater than or equal to 0.2 t but smaller than or equal to 0.8 t measured from base substrate-side ends of the side surfaces of the fixed end.

According to this application example, the SAW chip can be firmly fixed to the base substrate, and decrease in the aging characteristic can be prevented.

Application Example 4

In the SAW device according to the application example, it is preferable that the fixing member extends off outward in a direction from the free end of the SAW chip toward the fixed end thereof and outward from both sides of the SAW chip in the first direction in the plan view of the base substrate.

According to this application example, the SAW chip can be firmly fixed to the base substrate.

Application Example 5

In the SAW device according to the application example, the contour of the fixing member extends along the contour of the fixed end of the SAW chip in the plan view of the base substrate.

According to this application example, the SAW chip can be firmly fixed to the base substrate. In addition to this, the fixing member will not extend off excessively from the fixed end, whereby the volume of the fixing member can be reduced.

Application Example 6

In the SAW device according to the application example, it is preferable that the SAW chip is disposed in parallel to the base substrate.

According to this application example, the free end of the SAW chip will not come into contact with the base substrate, whereby the SAW chip will not be broken or fractured, and the reliability of the SAW device is improved.

Application Example 7

In the SAW device according to the application example, the SAW chip has a connection pad provided on a surface that faces away from the base substrate in a position above and within the fixing member in the plan view of the SAW chip.

According to this application example, a metal wire can be firmly bonded to the pad.

Application Example 8

In the SAW device according to the application example, it is preferable that the Young's modulus of the fixing member is greater than or equal to 0.02 GPa but smaller than or equal to 4 GPa.

According to this application example, the SAW chip can be firmly and stably fixed to the base substrate.

Application Example 9

A SAW oscillator according to this application example of the invention includes any of the SAW devices according to the application examples described above, and an oscillation circuit that applies a voltage to the comb electrode to oscillate the SAW chip.

According to this application example, a reliable SAW oscillator is provided.

Application Example 10

An electronic apparatus according to this application example of the invention includes any of the SAW devices according to the application examples described above.

According to this application example, a reliable electronic apparatus is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

A SAW device, a SAW oscillator, and an electronic apparatus according to embodiments of the invention will be described below in detail with reference to the accompanying drawings.

1. SAW Device

First Embodiment

A SAW device according to a first embodiment of the invention will first be described.

Figure 1:
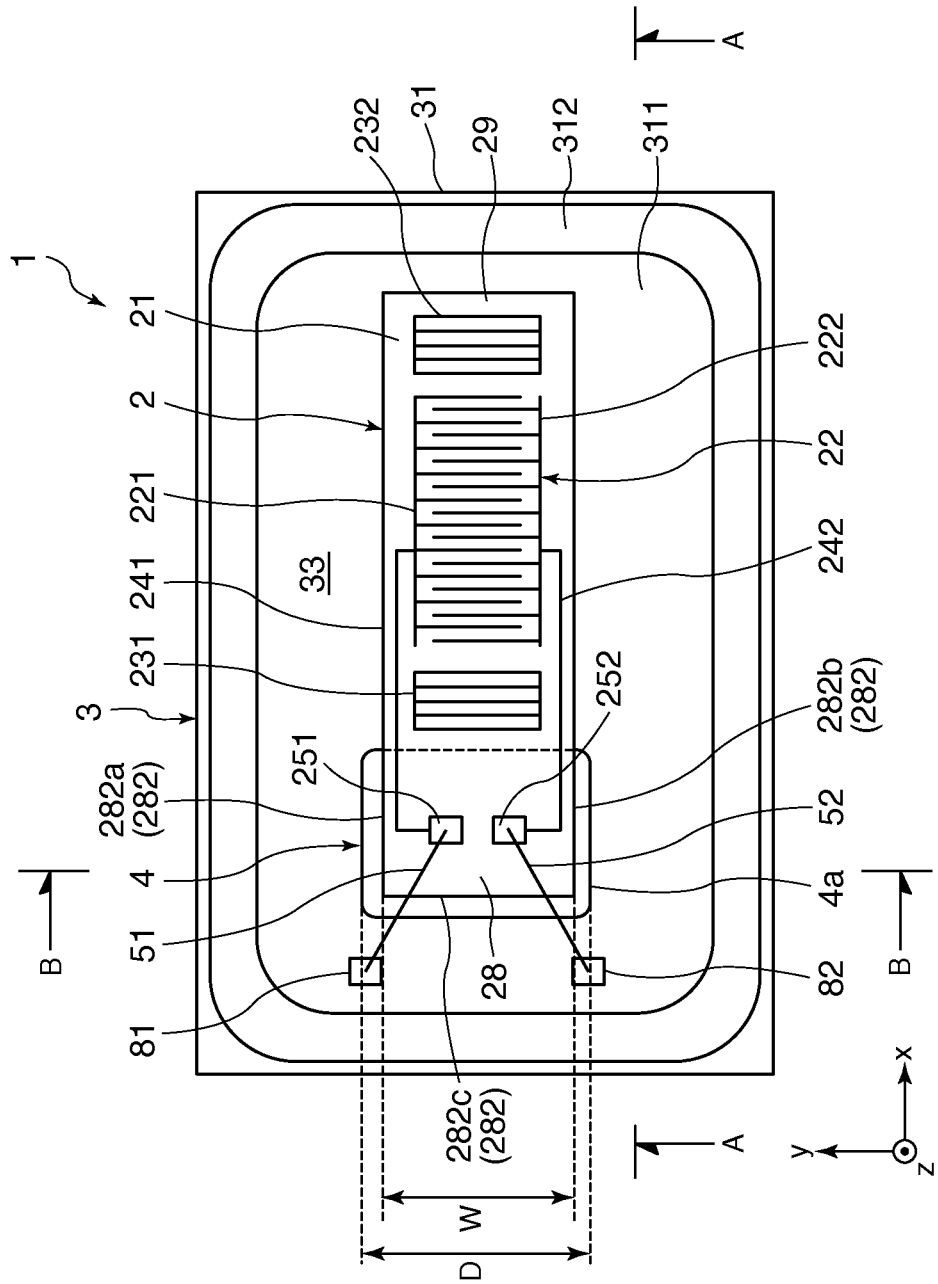
FIG. 1 is a plan view (top view) showing a SAW device according to a first embodiment of invention.
Figure 2:
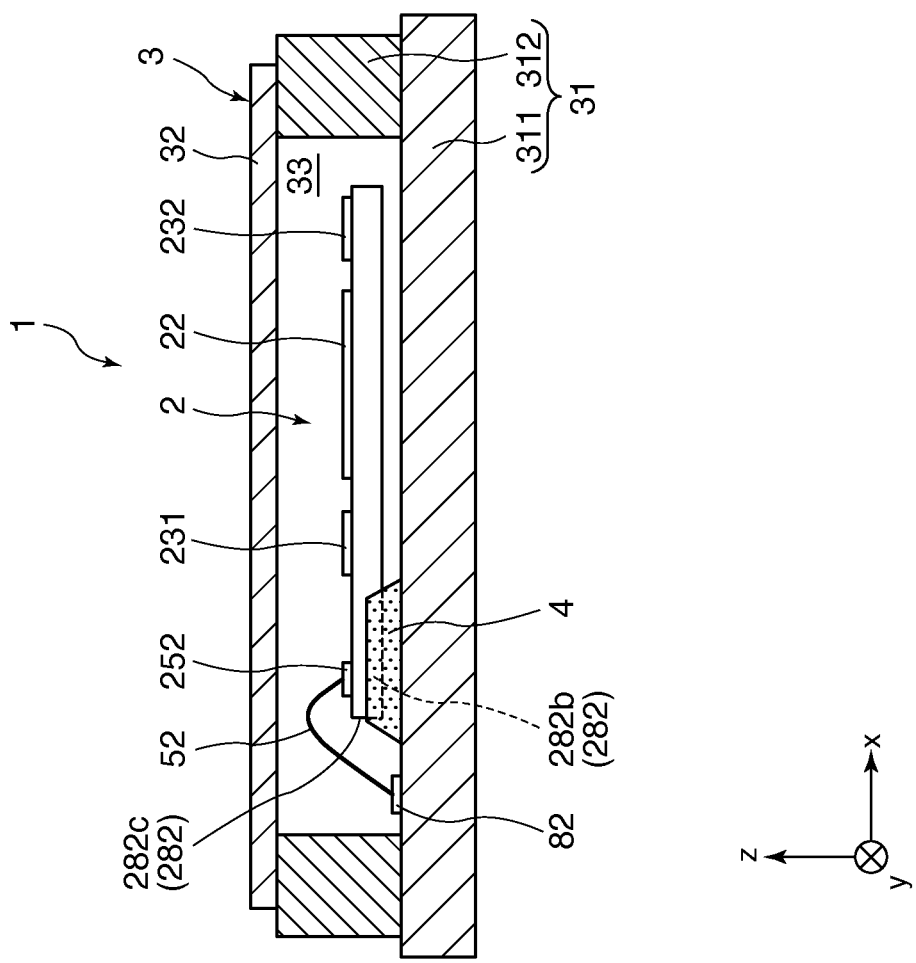
FIG. 2 is a cross-sectional view of the SAW device shown in FIG. 1 taken along the line A-A.
Figure 3:
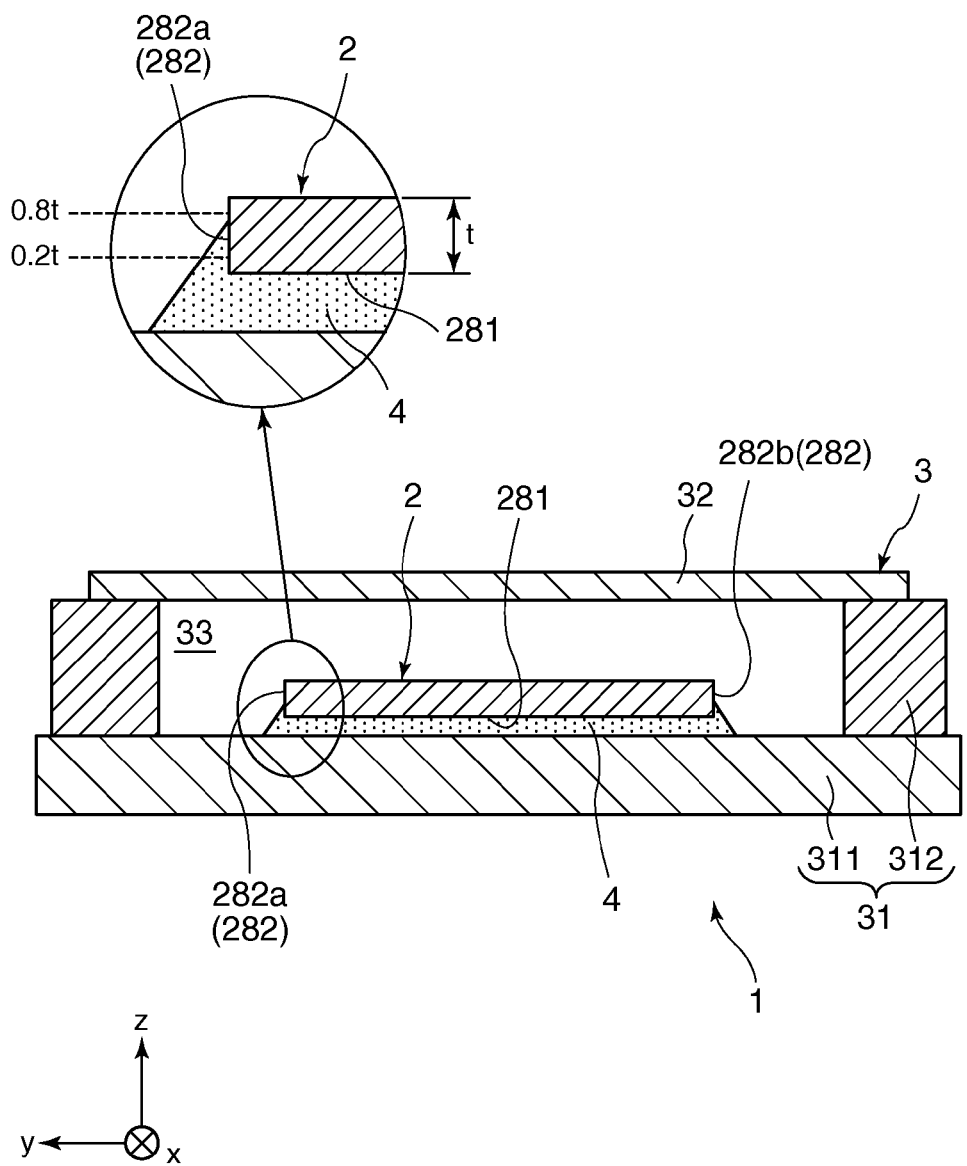
FIG. 3 is a cross-sectional view of the SAW device shown in FIG. 1 taken along the line B-B.

FIG. 1 is a plan view (top view) showing the SAW device according to the first embodiment of invention. FIG. 2 is a cross-sectional view of the SAW device shown in FIG. 1 taken along the line A-A. FIG. 3 is a cross-sectional view of the SAW device shown in FIG. 1 taken along the line B-B. In the following description, directional definitions are made with respect to the plane of view of FIG. 1 for the convenience of description: "up" refers to the direction oriented toward the reader; "down" refers to the direction oriented away from the reader; "left" refers to the direction oriented leftward; and "right" refers to the direction oriented rightward. Further, three axes perpendicular to one another are called x, y, and z axes, and the z axis coincides with the thickness direction of the SAW device (SAW chip), as shown in FIG. 1. Further, the direction parallel to the x axis is called an "x-axis direction," the direction parallel to the y axis is called a "y-axis direction," and the direction parallel to the z axis is called a "z-axis direction." In FIG. 1, a lid 32, which will be described later, is omitted.

A SAW device (surface acoustic wave device) 1 shown in FIG. 1 includes a SAW chip (surface acoustic wave element) 2, a package 3 that accommodates the SAW chip 2, and a fixing member 4 that fixes the SAW chip 2 to the package 3. The SAW device 1, which includes the SAW chip 2, can form a SAW resonator, a SAW oscillator, and other SAW-related devices.

The components described above will be sequentially described below in detail.

Package 3

The package 3 includes a package base 31 having a recess open upward and a lid 32 so bonded to the package base 31 that the lid 32 covers the recess, as shown in FIGS. 1 to 3. The package 3 has an accommodation portion 33 surrounded by the package base 31 and the lid 32, and the SAW chip 2 is so accommodated in the accommodation portion 33 that the SAW chip 2 is not in contact with the package 3. The interior of the accommodation portion 33 is preferably maintained under vacuum or filled with nitrogen.

The package base 31 is formed of a plate-shaped base substrate 311 and a frame-shaped sidewall 312 provided along the periphery of the upper surface of the base substrate 311. The base substrate 311 extends in the xy plane and has a thickness in the z-axis direction.

A pair of connection pads 81 and 82 are provided on the upper surface of the base substrate 311. The connection pads 81 and 82 are electrically connected to bonding pads 251 and 252, which belong to the SAW chip 2, with metal wires (bonding wires) 51 and 52 made, for example, of gold.

The package base 31 is preferably made of an insulating (non-conductive) material, for example, an aluminum oxide or any other variety of ceramics.

The lid 32 is not necessarily made of a specific material and may be made of a material whose coefficient of linear thermal expansion is similar to that of the material of which the package base 31 is made. For example, when the package base 31 is made of the ceramic described above, the lid 32 is preferably made of kovar or any other similar alloy. The lid 32 is bonded to the package base 31, for example, with a seal ring (not shown) therebetween in a seam welding process.

SAW Chip 2

The SAW chip 2 includes a plate-shaped piezoelectric substrate 21, an IDT (comb electrode) 22 provided on the upper surface of the piezoelectric substrate 21, a pair of reflectors 231 and 232 disposed on opposite sides of the IDT 22, extracting electrodes 241 and 242 electrically connected to the IDT 22, and bonding pads (pads) 251 and 252 electrically connected to the extracting electrodes 241 and 242, as shown in FIG. 1.

The piezoelectric substrate 21 extends in the xy plane and has a thickness in the z-axis direction. The piezoelectric substrate 21 in a plan view has a substantially rectangular shape whose longitudinal direction coincides with the x-axis direction.

The thus shaped piezoelectric substrate 21 is made of quartz. The piezoelectric substrate 21 made of quartz provides excellent temperature and frequency characteristics. The piezoelectric substrate 21 may alternatively be made, for example, of lithium tantalate, lithium niobate, lithium borate, or any other suitable piezoelectric material other than quartz.

The IDT 22 is disposed on the piezoelectric substrate 21 in a central portion thereof in the x-axis direction. The IDT 22 is formed of a pair of electrodes 221 and 222. The pair of electrodes 221 and 222 are so disposed that electrode fingers of the electrode 221 are interleaved with electrode fingers of the electrode 222.

When a voltage is applied between the pair of electrodes 221 and 222, the piezoelectric effect of the piezoelectric substrate 21 produces cyclic strain between the electrode fingers, and the cyclic strain induces a surface acoustic wave in the piezoelectric substrate 21. The induced surface acoustic wave propagates along the direction in which the electrode fingers are arranged (x-axis direction).

The pair of reflectors 231 and 232 are disposed on opposite sides of the IDT 22 in the direction in which the surface acoustic wave described above propagates (x-axis direction). The reflectors 231 and 232 have a function of reflecting the surface acoustic wave that propagates along the piezoelectric substrate 21 and containing the surface acoustic wave between the reflectors 231 and 232. Only one IDT is disposed between the reflectors 231 and 232 in FIG. 1, but the number of IDTs may be two or more.

The IDT 22 and the reflectors 231 and 232 are as a whole shifted toward one end of the piezoelectric substrate 21 in the longitudinal direction thereof as shown in FIG. 1 (shifted toward right end in FIG. 1). The pair of bonding pads 251 and 252 are formed on the upper surface on the other side of the piezoelectric substrate 21 (shifted to left end in FIG. 1). Further, the extracting electrodes 241 and 242 are formed on the upper surface of the piezoelectric substrate 21. The bonding pad 251 is electrically connected to the electrode 221 via the extracting electrode 241, and the bonding pad 252 is electrically connected to the electrode 222 via the extracting electrode 242.

As described above, the bonding pad 251 is electrically connected to the connection pad 81 via the metal wire 51, and the bonding pad 252 is electrically connected to the connection pad 82 via the metal wire 52.

The IDT 22, the reflectors 231 and 232, the extracting electrodes 241 and 242, and the bonding pads 251 and 252 can all be made of aluminum, an aluminum alloy, or any other metal material having excellent electrical conductivity.

The configuration of the SAW chip 2 has been described.

The thus configured SAW chip 2, specifically, the one end portion thereof in the longitudinal direction (left end portion in FIG. 1), is fixed (bonded) to the base substrate 311 via the fixing member 4, as shown in FIG. 1. That is, the base substrate 311 supports the SAW chip 2 as a cantilever having left and right ends in FIG. 1 as a fixed end 28 and a free end 29 respectively. Supporting the SAW chip 2 as a cantilever prevents deformation of the SAW chip 2 caused by an external force or thermal stress, whereby it is possible to effectively prevent the frequency characteristic of the SAW chip 2 from changing or degrading.

The SAW chip 2 is further so fixed to the base substrate 311 via the fixing member 4 in parallel to the base substrate 311, as shown in FIGS. 2 and 3. Maintaining the SAW chip 2 parallel to the base substrate 311 prevents the free end 29 of the SAW chip 2 from coming into contact with the base substrate 311 and hence the SAW chip 2 from being broken or fractured, whereby the reliability of the SAW device 1 is improved.

Further, the bonding strength between the bonding pads 251 and 252 and the metal wires 51 and 51 can be increased, whereby the reliability of the SAW device 1 is improved also in this regard. Specifically, the metal wire 51 is bonded to the bonding pad 251 in a known wire bonding process. The wire bonding process includes the steps of applying a high voltage to the tip of the metal wire 51, which has been allowed to protrude from the tip of a capillary, to form a ball (FAB), pressing the tip of the metal wire 51 against the bonding pad 251 downward in the z-axis direction, and applying ultrasonic vibration from the capillary to the bonding pad 251 to connect the metal wire 51 to the bonding pad 251 in a thermo-compression bonding manner. In the thus performed process, an oxide film on the surface of the bonding pad 251 is broken, and the metal wire 51 is firmly bonded to a newly formed surface of the bonding pad 251 to form a bonding interface, whereby the metal wire 51 can be firmly bonded to the bonding pad 251.

When the SAW chip 2 is parallel to the base substrate 311 in the wire bonding process described above, the bonding pad 251 is perpendicular to the z axis. In this case, the tip of the metal wire 51 can be perpendicularly pressed against the bonding pad 251 downward in the z-axis direction, whereby the pressing force at which the tip is pressed against the bonding pad can be large enough and the capillary can efficiently apply ultrasonic vibration to the bonding pad 251. As a result, the metal wire 51 can be more firmly bonded to the bonding pad 251, and the reliability of the SAW device 1 is improved accordingly.

In particular, the bonding pad 251 and 252 are so formed that they overlie the fixing member 4, in other words, they are located within the fixing member 4 in the plan view (xy-plane view), as shown in FIG. 1. Since the bonding pads 251 and 252 are supported by the fixing member 4, which is located immediately below the bonding pads 251 and 252 as described above, the ultrasonic vibration applied from the capillary will not leak elsewhere, whereby the metal wires 51 and 52 can be more firmly bonded to the bonding pads 251 and 252.

Further, the SAW chip 2 is fixed to the fixing member 4 with the surface of the SAW chip 2 on which the IDT 22 is disposed facing upward, as shown in FIG. 1. The configuration effectively prevents the IDT 22 from coming into contact with the fixing member 4, whereby it is possible to effectively prevent the aging characteristic of the SAW device 1 from degrading.

Fixing Member 4

The fixing member 4 is disposed between the SAW chip 2 and the base substrate 311 and fixes the SAW chip 2 to the base substrate 311, as shown in FIGS. 1 to 3. The thus configured fixing member 4 is not necessarily made of a specific material and can be made, for example, of a silicon-based adhesive, an epoxy-based adhesive, a polyimide-based adhesive, or any other variety of adhesives capable of fixing the SAW chip 2 to the base substrate 311.

Fixing the SAW chip 2 to the base substrate 311 via the fixing member 4 includes, for example, the steps of applying the fixing member 4 that is not yet hardened to the upper surface of the base substrate 311, placing the SAW chip 2 on the fixing member 4, lightly pressing the SAW chip 2 against the fixing member 4, and heating the fixing member 4 to a predetermined temperature to harden the fixing member 4.

The Young's modulus of the fixing member 4 is not limited to a specific value but is preferably greater than or equal to 0.02 GPa but smaller than or equal to 4 GPa. The Young's modulus within the range described above allows the SAW chip 2 to be firmly and stably fixed to the base substrate 311. When the Young's modulus is smaller than the lower limit described above, the leakage of the ultrasonic vibration from the SAW chip 2 increases in the wire bonding process described above although the amount of leakage depends on the shape, volume, and other factors of the fixing member 4. In this case, the bonding strength between the bonding pads 251, 252 and the metal wires 51, 52 can be disadvantageously insufficient. On the other hand, when the Young's modulus is greater than the upper limit described above, and the fixing member 4 that has hardened and contracted distorts the SAW chip 2 (piezoelectric substrate 21) although the amount of distortion depends on the shape, volume, and other factors of the fixing member 4, and the frequency characteristic of the SAW chip 2 can be disadvantageously changed or degraded.

The fixing member 4 is preferably made of an insulating material not to cause short circuit or any other electric failure. The fixing member 4 may alternatively be electrically conductive unless the fixing member 4 comes into contact with the connection pads 81 and 82 formed on the base substrate 311, the bonding pads 251 and 252, which belong to the SAW chip 2, or other pads and causes short circuit.

The thus configured fixing member 4 protrudes (extends off) outward from the entire circumference of the fixed end 28 of the SAW chip 2 in the xy plan view, and the protruding portion of the fixing member 4 is exposed, as shown in FIG. 1. The fixing member 4 is further so formed that it extends around from a lower surface 281 of the fixed end 28 of the SAW chip 2 to side surfaces 282 thereof and fixes the SAW chip 2, specifically, the lower surface 281 and the side surfaces 282 of the fixed end 28 of the SAW chip 2, to the base substrate 311, as shown in FIGS. 2 and 3. The SAW chip 2 can therefore be firmly fixed to the base substrate 311. Specifically, in the SAW device 1, fixing member 4 not only upwardly supports the SAW chip 2 but also supports the SAW chip 2 in the y-axis direction by sandwiching both sides thereof. The SAW chip 2 can therefore be fixed to the base substrate 311 more stably and firmly than in a case where a SAW chip is fixed to a base substrate only by using the lower surface of the SAW chip in related art.

A first advantage of the configuration described above is that leakage of the ultrasonic vibration from the SAW chip 2 is reduced in the wire bonding process described above, whereby the metal wires 51 and 52 can be firmly bonded to the bonding pads 251 and 252. A second advantage is that since the bonding strength between the SAW chip 2 and the base substrate 311 increases, high-level parallelism of the SAW chip 2 with the base substrate 311 can be readily achieved. As a result, the advantageous effect described above can be reliably provided.

In particular, in the present embodiment, the fixing member 4 is so formed that it protrudes outward from the entire circumference of the fixed end 28 of the SAW chip 2, as described above. Not only a pair of side surfaces 282a and 282b of the fixed end 28 that face each other in the y-axis direction but also a side surface 282c that connects the side surfaces 282a and 282b to each other are therefore fixed to the base substrate 311 via the fixing member 4. As a result, the SAW chip 2 can be more firmly fixed to the base substrate 311, and the advantageous effect described above becomes more pronounced.

Further, the shape of the contour of a portion 4a of the fixing member 4 that is exposed from the SAW chip 2 corresponds to the shape of the contour of the fixed end 28 of the SAW chip 2 in the xy plan view, as shown in FIG. 1. In other words, the amount of protrusion (protruding length) of the fixing member 4 from the fixed end 28 is substantially the same along the entire circumference of the fixed end 28. The thus shaped fixing member 4 allows the SAW chip 2 to be firmly fixed to the base substrate 311. In addition to this, since the fixing member 4 does not excessively extend off from the fixed end 28, the volume of the fixing member 4 can be reduced, which can reduce the amount of gas produced (outgassed) from the fixing member 4, whereby degradation in the aging characteristic due to the outgassing can be effectively reduced.

It is further preferable that the fixing member 4 is not present on the upper surface of the SAW chip 2. In other words, in the SAW device 1, it is preferable that the fixing member 4, which extends around to the side surfaces 282 of the fixed end 28 of the SAW chip 2, does not extend around to the upper surface thereof. When the fixing member 4, if it extends around to the upper surface of the SAW chip 2, comes into contact with the IDT 22, which is formed on the upper surface of the SAW chip 2, the aging characteristic of the SAW device 1 is degraded. The fixing member 4 is therefore preferably so formed that it does not extend around to the upper surface of the SAW chip 2.

Further, the fixing member 4 is so formed that it extends around to the side surfaces 282 of the fixed end 28 of the SAW chip 2, as described above. Now, let t be the thickness of the SAW chip 2 (piezoelectric substrate 21), as shown in FIG. 3. The fixing member 4 preferably reaches a height greater than or equal to 0.2 t measured from the lower ends of the side surfaces 282 of the fixed end 28. The fixing member 4 that reaches the height described above more reliably provides the advantageous effect described above, which is "the SAW chip 2 can be firmly fixed to the base substrate 311."

Further, the fixing member 4 preferably reaches a height of 1.0 t measured from the lower ends of the side surfaces 282 of the fixed end 28. That is, the fixing member 4 is preferably formed all over the side surfaces 282 of the fixed end 28 in the thickness direction. The thus shaped fixing member 4 makes the advantageous effect described above more pronounced.

The fixing member 4 formed all over the side surfaces 282 of the fixed end 28 in the thickness direction, however, tends to extend around from the side surfaces 282 of the fixed end 28 of the SAW chip 2 to the upper surface of the fixed end 28. In this case, the fixing member 4 can come into contact with the IDT 22, which can disadvantageously degrade the frequency and other characteristics of the SAW chip 2. The productivity and yield of the SAW device 1 can therefore decrease when the fixing member 4 is formed all over the side surfaces 282 of the fixed end 28 in the thickness direction. To solve the problem, the fixing member 4 preferably reaches a height smaller than or equal to 0.8 t measured from the lower ends of the side surfaces 282 of the fixed end 28.

That is, the fixing member 4 preferably reaches a height greater than or equal to 0.2 t measured from the lower ends of the side surface 282 of the fixed end 28 but smaller than or equal to 0.8 t thereof. The thus shaped fixing member 4 not only allows the SAW chip 2 to be firmly fixed to the base substrate 311 but also prevents decrease in productivity and yield of the SAW device 1.

Now, let W be the length of the fixed end 28 of the SAW chip 2 in the y-axis direction (direction perpendicular to the x-axis direction, which is the direction in which the fixed end 28 and the free end 29 are apart from each other (first direction) in the xy plan view), and let D be the length of the fixing member 4 in the y-axis direction. The SAW device 1 is so configured that $1<D/W\leq1.6$ is satisfied. The length W is not limited to a specific value but ranges, for example, from about 0.5 to 2.0 mm. Further, the fixing member 4, which is made of an adhesive, in many cases does not have a perfect rectangular shape but has a substantially rectangular shape with the outermost circumferential portion waved when the adhesive is applied and dried. In this case, D represents the greatest length of the fixing member in the y-axis direction.

When the relationship described above is satisfied, the SAW device 1 has an excellent aging characteristic. That is, the amount of time-course variation in oscillation frequency (resonant frequency) of the SAW device 1 can be reduced.

The acceptable amount of time-course variation in oscillation frequency of the SAW device 1 is not limited to a specific value, but the amount of variation in oscillation frequency at a point somewhere after the SAW device 1 has been continuously driven for 10 years in a room temperature (25° C.) atmosphere preferably falls within a ±10 ppm. Since the oscillation frequency of the SAW device 1 gradually changes with time, satisfying the condition described above means that maintaining the oscillation frequency of the SAW device 1 within ±10 ppm of the oscillation frequency before the aging for 10 years. The SAW device 1 that satisfies the condition can be used suitably as a reference oscillation source, for example, in a wireless base station where a high-level aging characteristic is required.

When D/W is smaller than or equal to the lower limit described above, the fixing member 4 cannot extend around to the side surfaces 282 of the SAW chip 2. In this case, the SAW chip 2 cannot be fixed stably or firmly to the base substrate 311. On the other hand, when D/W is greater than the upper limit described above, the volume (amount) of the fixing member 4 becomes too large. In this case, substances resulting from outgassing and other reactions in the fixing member 4 degrades the aging characteristic of the SAW device 1 (increases time-course variation in oscillation frequency).

Figure 5:
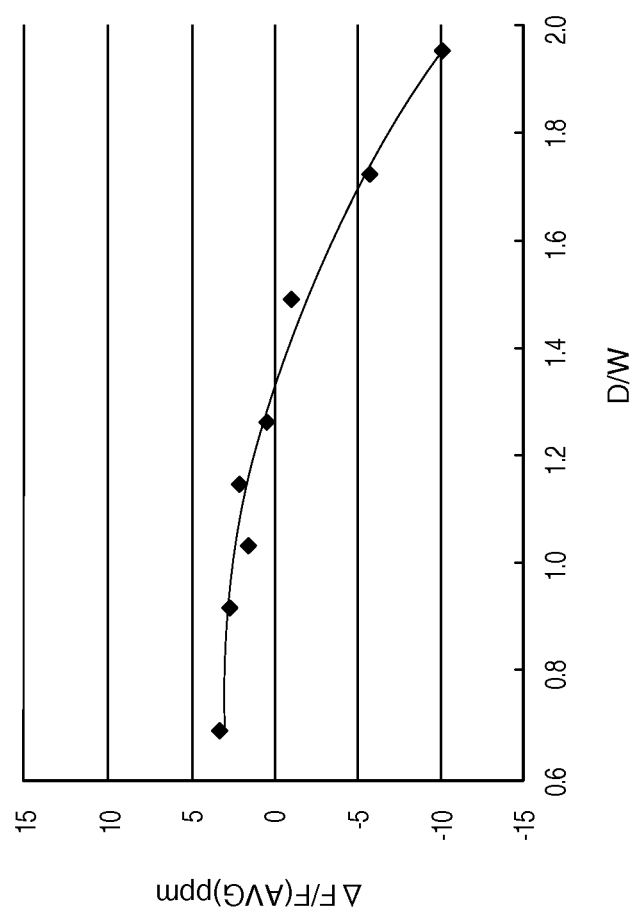
FIG. 5 shows a graph representing the relationship between D/W and ΔF/F (AVG).

FIG. 5 shows a graph representing the relationship between D/W and ΔF/F (AVG). ΔF/F (AVG) represents the average of the amounts of variation ΔF/F in the oscillation frequencies of 22 samples of the SAW device 1 at a point somewhere after aging. ΔF/F can be expressed by $(F_1-F_0)/F_0$, where $F_0$ represents the oscillation frequency of a sample before aging, and $F_1$ represents the oscillation frequency of the sample after aging. The aging was performed in a 125° C. atmosphere for a continuous drive period of 1000 hours.

Figure 6:
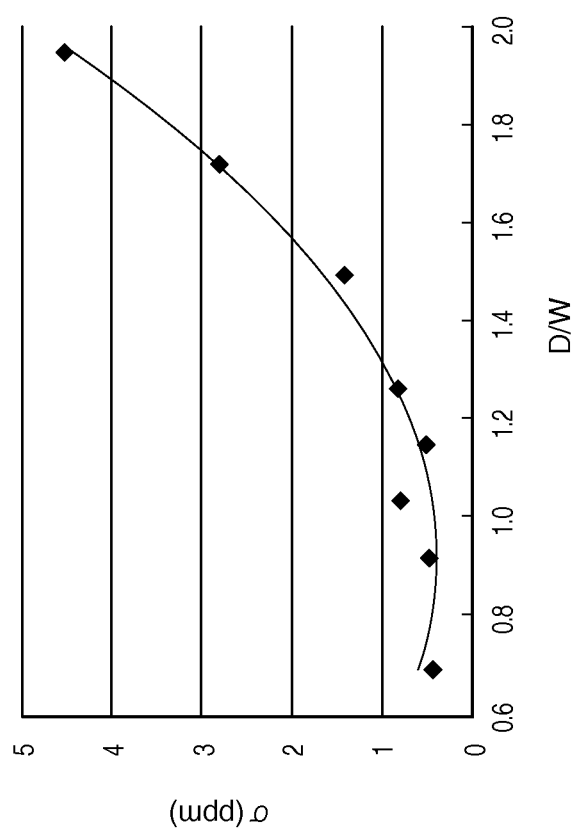
FIG. 6 shows a graph representing standard deviation σ of variation in ΔF/F.

FIG. 6 shows a graph representing standard deviation σ of the variation in ΔF/F of the 22 samples described above. That is, σ=0 means that ΔF/F does not vary among the samples, whereas a large σ means that ΔF/F greatly varies among the samples.

Figure 7:
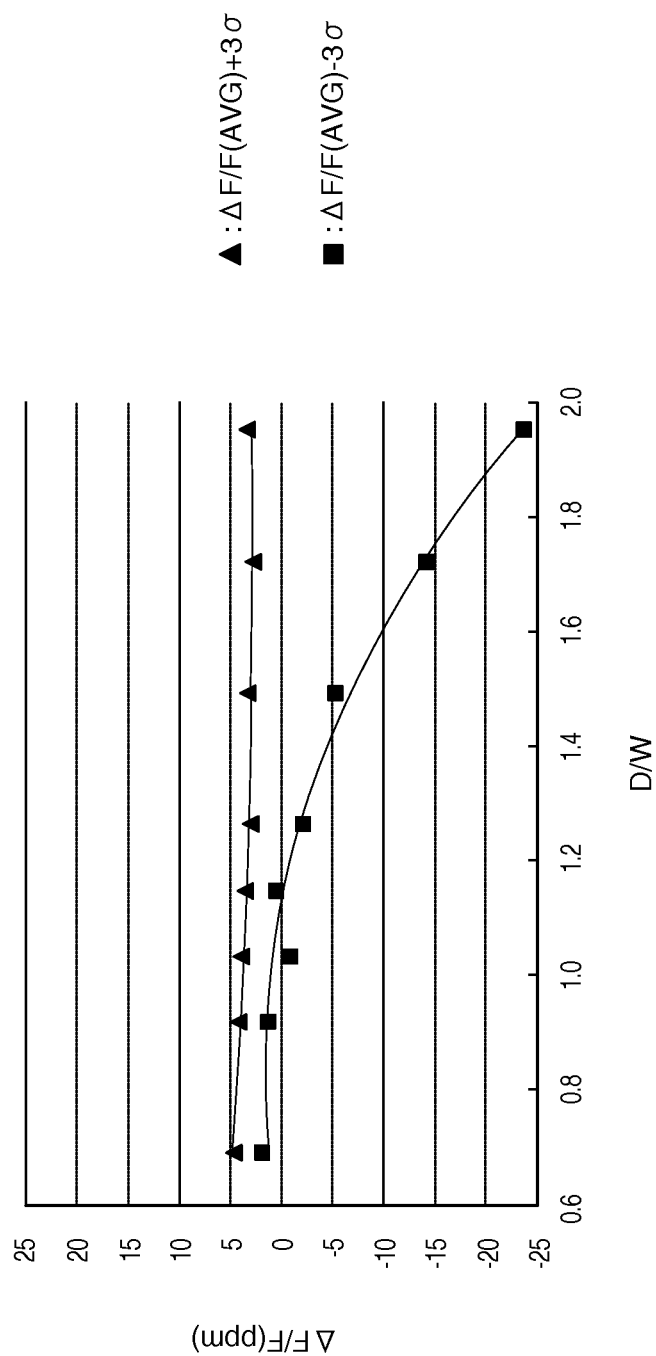
FIG. 7 shows graphs representing [ΔF/F (AVG)+3σ] and [ΔF/F (AVG)−3σ].

FIG. 7 shows a graph obtained by plotting ΔF/F (AVG) shown in FIG. 5 to which σ shown in FIG. 6 multiplied by three is added and a graph obtained by plotting ΔF/F (AVG) shown in FIG. 5 from which σ shown in FIG. 6 multiplied by three is subtracted, that is, graphs obtained by plotting [ΔF/F (AVG)+3σ] and [ΔF/F (AVG)−3σ].

When the SAW device 1 is manufactured in volume, at least 99.7% of the SAW devices 1, that is, most of the volume-manufactured SAW devices 1, have ΔF/F that falls within ΔF/F (AVG)±3σ. Further, the aging condition described above, "a 125° C.-atmosphere for continuous drive period of 1000 hours," corresponds to a 5° C.-atmosphere for continuous drive period of 300 years and a 45° C.-atmosphere for continuous drive period of 12 years.

In view of the fact described above, when the relationship of −10 ppm≤ΔF/F (AVG)±3σ≤10 ppm is satisfied, variation in frequency of almost all the manufactured SAW devices 1 having been driven continuously for 10 years in an atmosphere of room temperature (25° C.)±20° C. falls within ±10 ppm. As a result, the thus manufactured SAW devices 1 can be suitably used as a reference oscillation source, for example, in a wireless base station as described above. To satisfy −10 ppm≤ΔF/F (AVG)±3σ≤10 ppm, D/W may be set at 1.6 or smaller, as shown in FIG. 7.

It is noted that the lower limit of D/W is not limited to a specific value in consideration only of the aging characteristic, as shown in FIG. 7. When D/W is lower than or equal to 1, however, the SAW chip 2 cannot disadvantageously be stably or firmly fixed to the base substrate 311, as described above. To fix the SAW chip 2 stably and firmly to the base substrate 311 and provide an excellent aging characteristic, the SAW device 1 is therefore configured to satisfy $1<D/W\leq1.6$.

The SAW chip 2 in the SAW device 1 used as any of the samples described above had an xy-plane dimension of about 3.2×0.9 mm and a thickness of about 0.5 mm. Further, the fixing member 4 had a substantially rectangular shape having a length of about 1.0 mm in the X direction and a thickness of about 0.9 mm, and the fixing member 4 reached a height of about 0.6 t measured from the ends of the side surfaces 282 of the fixed end 28 that face the base substrate 311. Further, the fixing member 4, which had a substantially rectangular shape, had an outermost peripheral shape that was waved within a range of about 0.1 mm, and the length D of the fixing member 4 was about 1.1 mm, which was the greatest length of the contour thereof in the Y direction.

The SAW device 1 has been described above. According to the thus configured SAW device 1, the aging characteristic of the SAW chip 2, the bonding strength between the metal wires 51 and 52 and the SAW chip 2, and the parallelism of the SAW chip 2 with the base substrate 311 can be maintained at high levels.

Figure 4A:
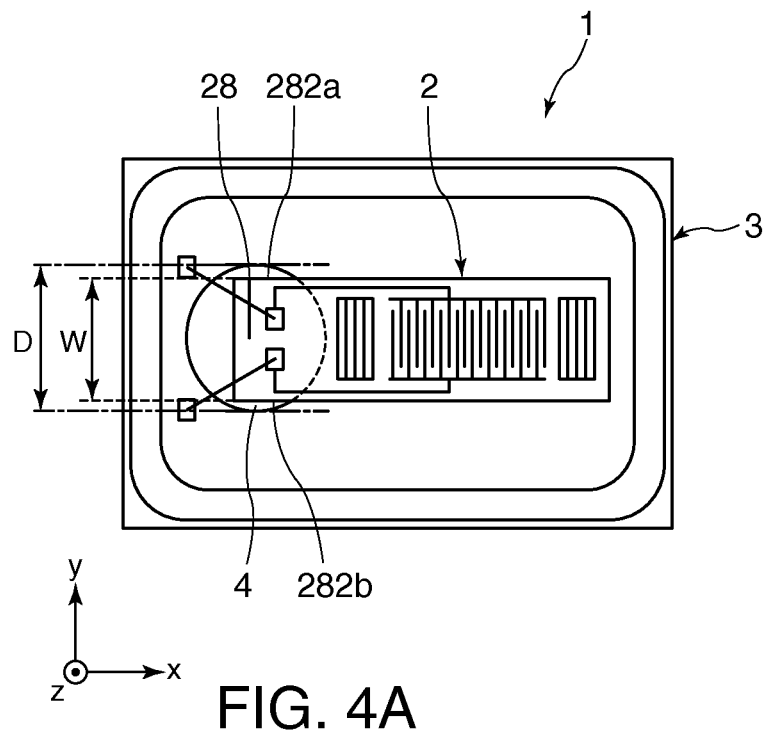
FIGS. 4A and 4B are plan views showing variations of a fixing member provided in the SAW device shown in FIG. 1.
Figure 4B:
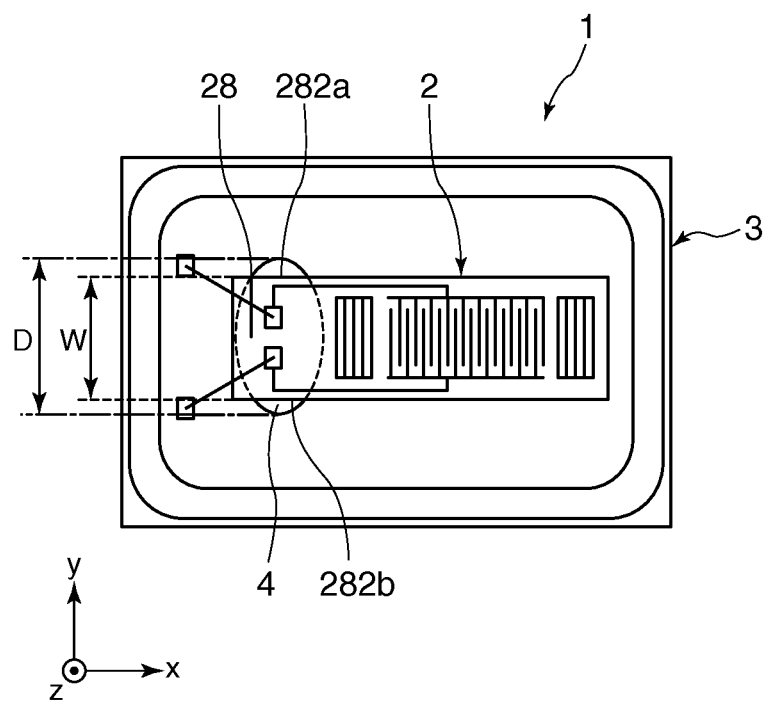

In the SAW device 1 according to the present embodiment, the fixing member 4 protrudes from the entire circumference of the fixed end 28 of the SAW chip 2. The fixing member 4 may alternatively protrude at least from the side surfaces 282a and 282b of the fixed end 28 that face each other in the y-axis direction. Specifically, for example, the fixing member 4 may have an elliptical shape elongated in the y-axis direction and protrude from the side surfaces 282a and 282b but may not protrude from the side surface 282c, as shown in FIG. 4B.

Further, in the SAW device 1 according to the present embodiment, the shape of the contour of the fixing member 4 corresponds to the shape of the contour of the fixed end 28 of the SAW chip 2. The shape of the contour of the fixing member 4 does not necessarily correspond to the shape of the contour of the fixed end 28 of the SAW chip 2. Specifically, the fixing member 4 may, for example, have a circular shape as shown in FIG. 4A or a different shape.

Second Embodiment

A SAW device according to a second embodiment of the invention will next be described.

Figure 8:
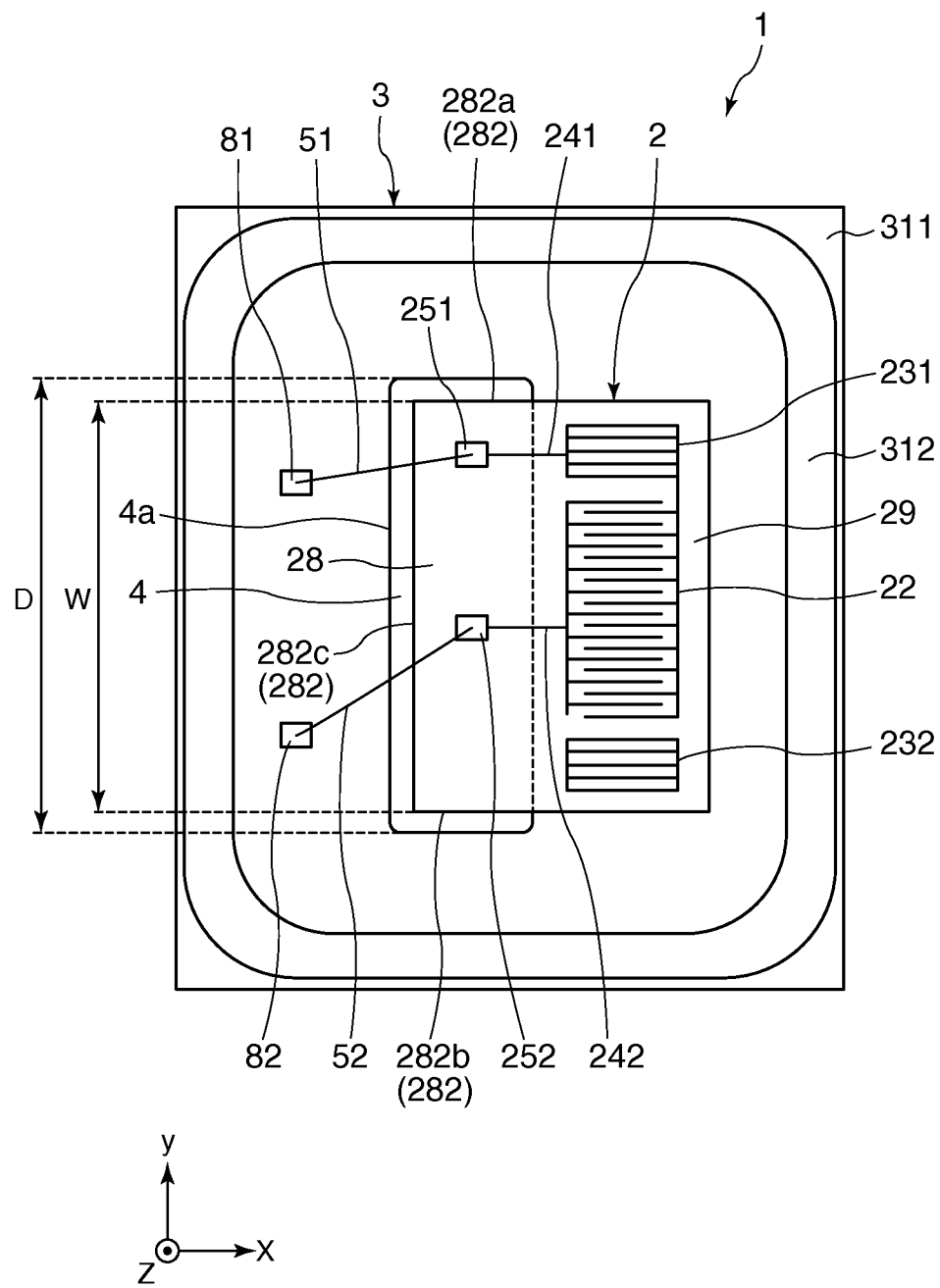
FIG. 8 is a plan view (top view) of a SAW device according to a second embodiment of invention.

FIG. 8 is a plan view (top view) of the SAW device according to the second embodiment of invention. In FIG. 8, a lid 32 is omitted for convenience of description.

The SAW device according to the second embodiment will be described below primarily about differences from the embodiment described above, and no description of the same items will be made.

The SAW device according to the second embodiment of the invention is substantially the same as the SAW device according to the first embodiment described above and only differs therefrom in terms of the configuration of the SAW chip. The same components as those in the first embodiment described above have the same reference characters.

A SAW chip 2 provided in a SAW device 1 according to the present embodiment has an IDT 22 formed on a piezoelectric substrate 21 in a right-side portion thereof and in a central portion thereof in the y-axis direction in FIG. 8 and a pair of reflectors 231 and 232 formed on opposite sides of the IDT 22 in the y-axis direction, as shown in FIG. 8. In the thus configured SAW chip 2, an induced surface acoustic wave propagates in the y-axis direction.

The SAW chip 2, specifically, a left-side portion thereof in FIG. 8, is fixed to a base substrate 311 via a fixing member 4. That is, the SAW chip 2 is so fixed to the base substrate 311 that the left end of the SAW chip 2 in FIG. 8 is a fixed end 28 and the right end of the SAW chip 2 in FIG. 8 is a free end 29.

In the thus configured second embodiment, the same advantageous effect as that provided in the first embodiment described above is provided.

2. SAW Oscillator

A SAW oscillator into which any of the SAW devices 1 described above is incorporated (SAW oscillator according to an embodiment of the invention) will next be described.

Figure 9:
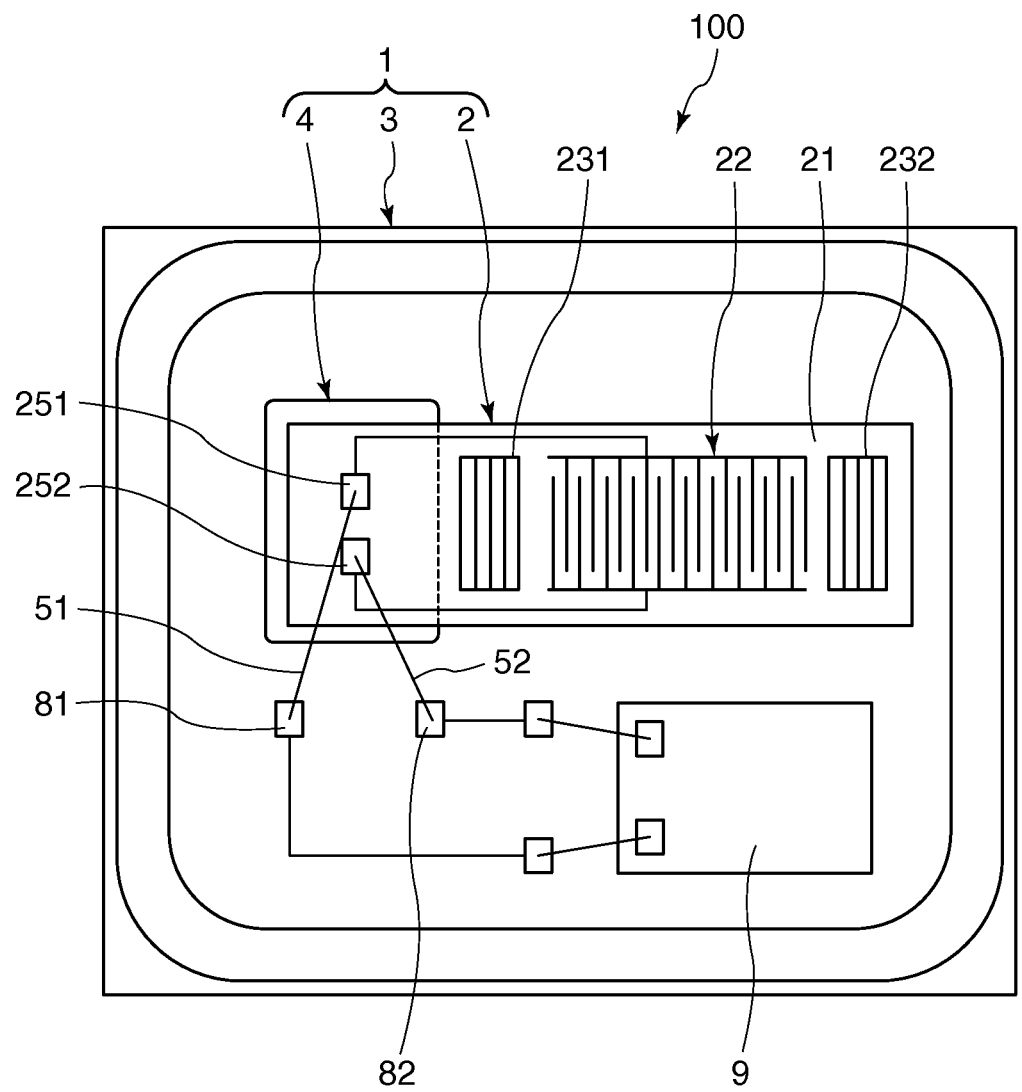
FIG. 9 is a plan view (top view) of a SAW oscillator according to an embodiment of the invention.

A SAW oscillator 100 includes any of the SAW devices 1 and an IC chip 9, as shown in FIG. 9. The IC chip 9 is provided in the accommodation portion 33 and so fixed to the base substrate 311 that the IC chip 9 and the SAW chip 2 are disposed side by side. The thus configured IC chip 9 is electrically connected to the SAW chip 2 via connection pads 81 and 82, and an oscillation circuit (circuit that oscillates SAW chip 2) built in the IC chip 9 can oscillate the SAW chip 2.

3. Electronic Apparatus

The SAW device 1 described above can be incorporated into a variety of electronic apparatus. The electronic apparatus into which the SAW device 1 is incorporated is not limited to a specific one and may include a personal computer (mobile personal computer, for example); a mobile phone and any other portable terminal; a digital still camera; an inkjet discharger (inkjet printer, for example), a laptop personal computer, a tablet personal computer, a router, a switch, and other storage area network apparatus; a local-area network apparatus, a television receiver, a video camcorder, a video tape recorder, a car navigation system, a pager, an electronic organizer (including one with communication capability), an electronic dictionary, a desktop calculator, an electronic game console, a game controller, a word processor, a workstation, a TV phone, a security TV monitor, electronic binoculars, a POS terminal, a medical apparatus (electronic clinical thermometer, blood-pressure gauge, blood-sugar gauge, electrocardiograph, ultrasonic diagnostic apparatus, and electronic endoscope, for example), a fish finder, a variety of measurement apparatus, a variety of instruments (instruments for vehicle, airplane, and ship), a flight simulator, a head-mount display, a motion tracer, a motion tracker, a motion controller, and a PDR (pedestrian dead reckoning) apparatus.

The SAW device, the SAW oscillator, and the electronic apparatus according to the illustrated embodiments of the invention have been described above, but the invention is not limited thereto. The configuration of each of the components can be replaced with an arbitrary configuration that has the same function. Further, other arbitrary configurations and steps may be added. Moreover, the SAW device, the SAW oscillator, and the electronic apparatus according to embodiments of the invention may be combinations of at least arbitrary two configurations (features) of the embodiments described above.

The above embodiments have been described with reference to the configuration in which the SAW chip is fixed to the base substrate in parallel thereto, but the SAW chip may alternatively be inclined to the base substrate. Specifically, the free end may be so inclined to the base substrate that it is set apart from the base substrate by a greater amount than the fixed end. Conversely, the free end may be so inclined to the base substrate that it is set apart from the base substrate by a smaller amount than the fixed end.

The entire disclosure of Japanese Patent Application No. 2011-165798, filed Jul. 28, 2011 is expressly incorporated by reference herein.

What is claimed is:

1. A SAW device comprising:
   a SAW chip including a plate-shaped piezoelectric substrate and a comb electrode disposed on the piezoelectric substrate;
   a base substrate on which the SAW chip is mounted; and
   a fixing member that fixes the SAW chip to the base substrate and supports the SAW chip that forms a cantilever in a position where the comb electrode does not overlap with the fixing member in a plan view of the SAW chip,
   wherein the comb electrode is disposed on a surface of the piezoelectric substrate that faces away from the base substrate,
   a length W of the SAW chip in a first direction and a length D of the fixing member in the first direction satisfy $1 < D/W \leq 1.6$, the first direction being perpendicular to a direction in which a fixed end and a free end of the SAW chip are apart from each other in a plan view of the base substrate, and the fixing member bonds a surface of the fixed end of the SAW chip that faces the base substrate and a pair of side surfaces of the fixed end of the SAW chip that face each other in the first direction to the base substrate.

2. The SAW device according to claim 1,
wherein the piezoelectric substrate is made of quartz.

3. A SAW oscillator comprising:
the SAW device according to claim 2; and
an oscillation circuit that applies a voltage to the comb electrode to oscillate the SAW chip.

4. An electronic apparatus comprising the SAW device according to claim 2.

5. The SAW device according to claim 1,
wherein the fixed end of the piezoelectric substrate has a thickness t, and
the fixing member reaches a height greater than or equal to 0.2 t but smaller than or equal to 0.8 t measured from base substrate-side ends of the side surfaces of the fixed end.

6. A SAW oscillator comprising:
the SAW device according to claim 3; and
an oscillation circuit that applies a voltage to the comb electrode to oscillate the SAW chip.

7. An electronic apparatus comprising the SAW device according to claim 3.

8. The SAW device according to claim 1,
wherein the fixing member extends off outward in a direction from the free end of the SAW chip toward the fixed end thereof and outward from both sides of the SAW chip in the first direction in the plan view of the base substrate.

9. A SAW oscillator comprising:
the SAW device according to claim 4; and
an oscillation circuit that applies a voltage to the comb electrode to oscillate the SAW chip.

10. An electronic apparatus comprising the SAW device according to claim 4.

11. The SAW device according to claim 1,
wherein the contour of the fixing member extends along the contour of the fixed end of the SAW chip in the plan view of the base substrate.

12. A SAW oscillator comprising:
the SAW device according to claim 5; and
an oscillation circuit that applies a voltage to the comb electrode to oscillate the SAW chip.

13. An electronic apparatus comprising the SAW device according to claim 5.

14. The SAW device according to claim 1,
wherein the SAW chip is disposed in parallel to the base substrate.

15. A SAW oscillator comprising:
the SAW device according to claim 6; and
an oscillation circuit that applies a voltage to the comb electrode to oscillate the SAW chip.

16. An electronic apparatus comprising the SAW device according to claim 6.

17. The SAW device according to claim 1,
wherein the SAW chip has a connection pad provided on a surface that faces away from the base substrate in a position above and within the fixing member in the plan view of the SAW chip.

18. The SAW device according to claim 1,
wherein the Young's modulus of the fixing member is greater than or equal to 0.02 GPa but smaller than or equal to 4 GPa.

19. A SAW oscillator comprising:
the SAW device according to claim 1; and
an oscillation circuit that applies a voltage to the comb electrode to oscillate the SAW chip.

20. An electronic apparatus comprising the SAW device according to claim 1.

* * * * *